US006169355B1

(12) United States Patent
Furlani et al.

(10) Patent No.: US 6,169,355 B1
(45) Date of Patent: Jan. 2, 2001

(54) PIEZOELECTRIC ACTUATING ELEMENT FOR AN INK JET HEAD AND THE LIKE

(75) Inventors: Edward P. Furlani, Lancaster; Syamal K. Ghosh; Dilip K. Chatterjee, both of Rochester, all of NY (US)

(73) Assignee: Eastman Kodak Company, Rochester, NY (US)

( * ) Notice: Under 35 U.S.C. 154(b), the term of this patent shall be extended for 0 days.

(21) Appl. No.: 09/120,995

(22) Filed: Jul. 22, 1998

(51) Int. Cl.[7] .......... H01L 41/08

(52) U.S. Cl. .......... 310/358; 310/328; 310/330

(58) Field of Search .......... 310/328, 330–331, 310/357–359, 366, 324

(56) References Cited

U.S. PATENT DOCUMENTS 4,115,789 * 9/1978 Fischbeck .......... 310/328 X
4,356,424 * 10/1982 Marcus .......... 310/330 X
4,375,042 * 2/1983 Marcus .......... 310/330 X
4,700,203 * 10/1987 Yamamuro et al. .......... 310/800 X
5,589,725 * 12/1996 Haertling .......... 310/330 X

* cited by examiner

*Primary Examiner*—Mark O. Budd
(74) *Attorney, Agent, or Firm*—Clyde E. Bailey, Sr.

(57) ABSTRACT

An ink jet head has body having a plurality of independent ink compartments each having an inlet orifice, an outlet orifice and a piezoelectric ink actuating element structurally associated with each of said independent ink compartments, said piezoelectric ink actuating element enabling said ink jet head to receive ink from an ink reservoir in fluid communications with said inlet orifice of each one of said plurality of independent ink compartments and then eject droplets of the ink onto a receiver to form an image. The piezoelectric actuating element includes a substantially planar piezoelectric transducer comprising a slab of piezoelectric material having a functionally gradient d-coefficient selected so that the slab changes geometry in response to an applied voltage which produces an electric field in the slab.

5 Claims, 7 Drawing Sheets

PIEZOELECTRIC ACTUATING ELEMENT FOR AN INK JET HEAD AND THE LIKE

CROSS REFERENCE TO RELATED APPLICATIONS

Reference is made to commonly assigned U.S. Patent Application Ser. No. 09/071,485, filed May 1, 1998, entitled "Controlled Composition and Crystallographic Changes in Forming Functionally Gradient Piezoelectric Transducers" by Chatterjee et al, U.S. patent application Ser. No. 09/071,486 filed May 1, 1998, entitled "Functionally Gradient Piezoelectric Transducers" by Furlani et al, and U.S. patent application Ser. No. 09/093,268 filed Jun. 8, 1998, entitled "Using Morphological Changes to Make Piezoelectric Transducers", by Chatterjee et al, the disclosures of which are incorporated herein by reference.

FIELD OF THE INVENTION

The invention relates generally to the field of ink jet printing and, more particularly, to an ink jet head that utilizes a functionally gradient piezoelectric element.

BACKGROUND OF THE INVENTION

Piezoelectric ink jet elements are used in a wide range of micro-fluidic printing devices. Conventional ink jet elements utilize piezoelectric transducers that comprise one or more uniformly polarized piezoelectric elements with attached surface electrodes. The three most common transducer configurations are multilayer ceramic, mono-morph or bi-morphs, and flex-tensional composite transducers. To activate a transducer, a voltage is applied across its electrodes thereby creating an electric field throughout the piezoelectric elements. This field induces a change in the geometry of the piezoelectric elements resulting in elongation, contraction, shear or combinations thereof. The induced geometric distortion of the elements can be used to implement motion or perform work. In particular, piezoelectric bimorph transducers that produce a bending motion, are commonly used in micro-pumping devices. However, a drawback of the conventional piezoelectric bimorph transducer is that two bonded piezoelectric elements are needed to implement the bending. These bimorph transducers are typically difficult and costly to manufacture for micro-pumping applications (in this application, the word micro means that the dimensions of the element range from 100 microns to 10 mm). Also, when multiple bonded elements are used, stress induced in the elements due to their constrained motion can damage or fracture an element due to abrupt changes in material properties and strain at material interfaces.

Therefore, a need persists for an ink jet head that overcomes the aforementioned problems associated with conventional ink jet apparatus.

SUMMARY OF THE INVENTION

It is, therefore, an object of the present invention to provide an ink jet head actuated by a functionally gradient piezoelectric actuating element.

It is a feature of the invention that a functionally gradient piezoelectric transducer integral to an ink jet head actuates the flow of ink from an ink compartment where droplets of ink are emitted from the ink jet head.

To accomplish these and other objects of the invention, there is provided an ink jet head having a body, a base attached to the body, the body having a plurality of independent ink compartments each having an inlet and outlet orifice and a piezoelectric actuating element associated therewith. The actuating element enables the ink jet head to receive ink from an ink reservoir in fluid communications with the inlet orifices of the independent ink compartments and then eject droplets of the ink onto a receiver to form an image. The piezoelectric actuating element includes a substantially planar piezoelectric transducer comprising a slab of piezoelectric material. According to the invention, the slab has a first surface and an opposing second surface. A plurality of spatially separated first electrodes are arranged on the first surface of the slab. A second electrode extends substantially lengthwise along the opposed second surface. Piezoelectric material of the invention has a functionally gradient d-coefficient selected so that the slab changes geometry in response to an applied voltage which produces an electric field in the slab. The plurality of first electrodes and second electrode are arranged so that voltage applied to any one of the plurality of first electrodes and second electrode induces an electric field in a portion of the slab between the select one of the plurality of first electrodes and the second electrode. Further, a source of power operably associated with each one of the plurality of first electrodes and to the second electrode of the piezoelectric transducer for enabling fluid flow through the ink compartment. When the piezoelectric transducer is energized to pump fluid from the ink storage chamber, the source of power provides a negative voltage to the first terminal and a positive voltage to the second terminal. On the other hand, when the piezoelectric transducer is energized to pump fluid into the ink compartment, the source of power provides a positive voltage to the first terminal and a negative voltage to the second terminal.

BRIEF DESCRIPTION OF THE DRAWINGS

The above and objects, features and advantages of the present invention will become apparent when taken in conjunction with the following description and drawings wherein identical reference numerals have been used, where possible, to designate identical features that are common to the figures, and wherein.

DETAILED DESCRIPTION OF THE INVENTION

Figure 1:
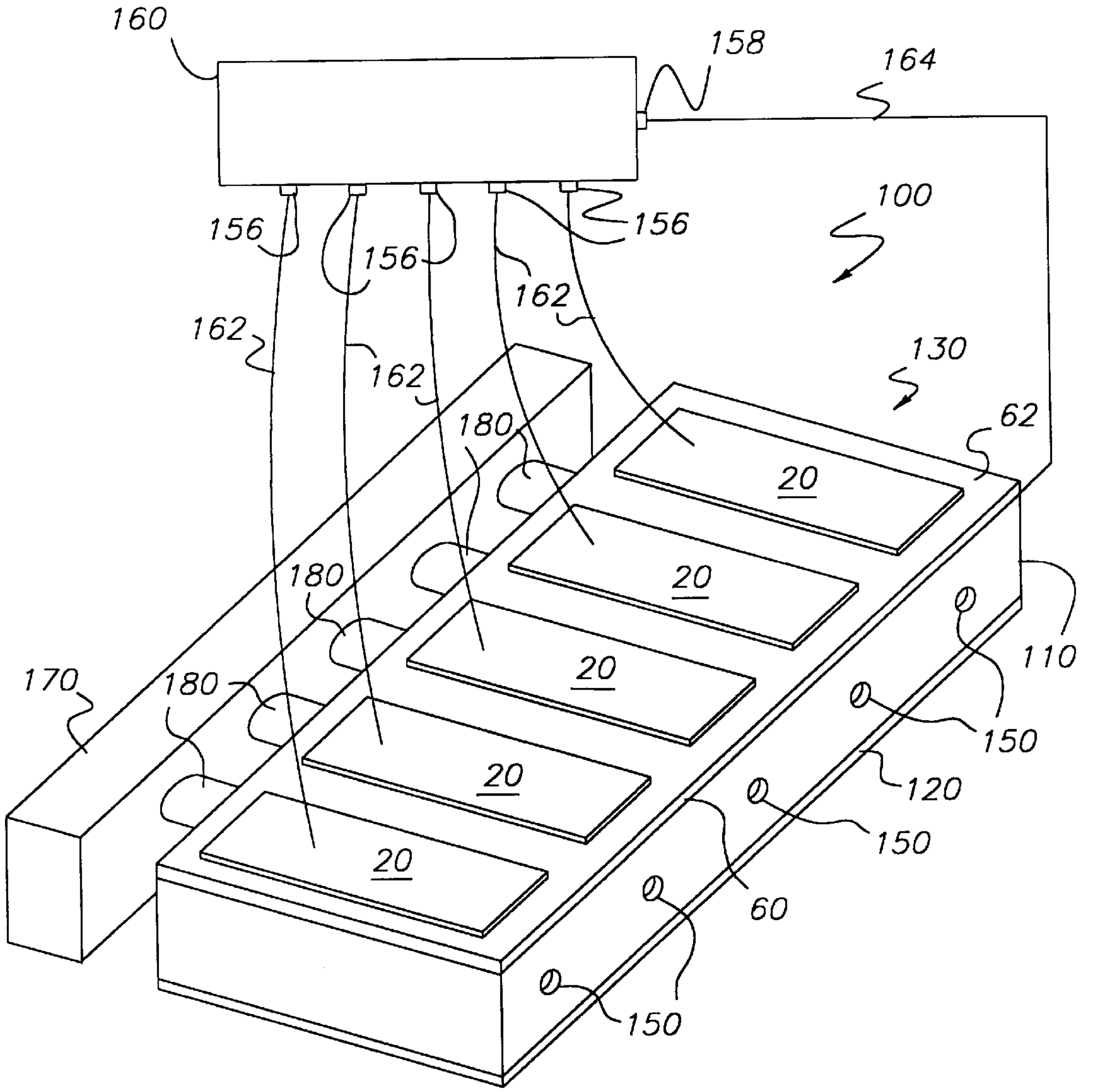
FIG. 1 is a perspective view of the ink jet head of the invention.
Figure 2:
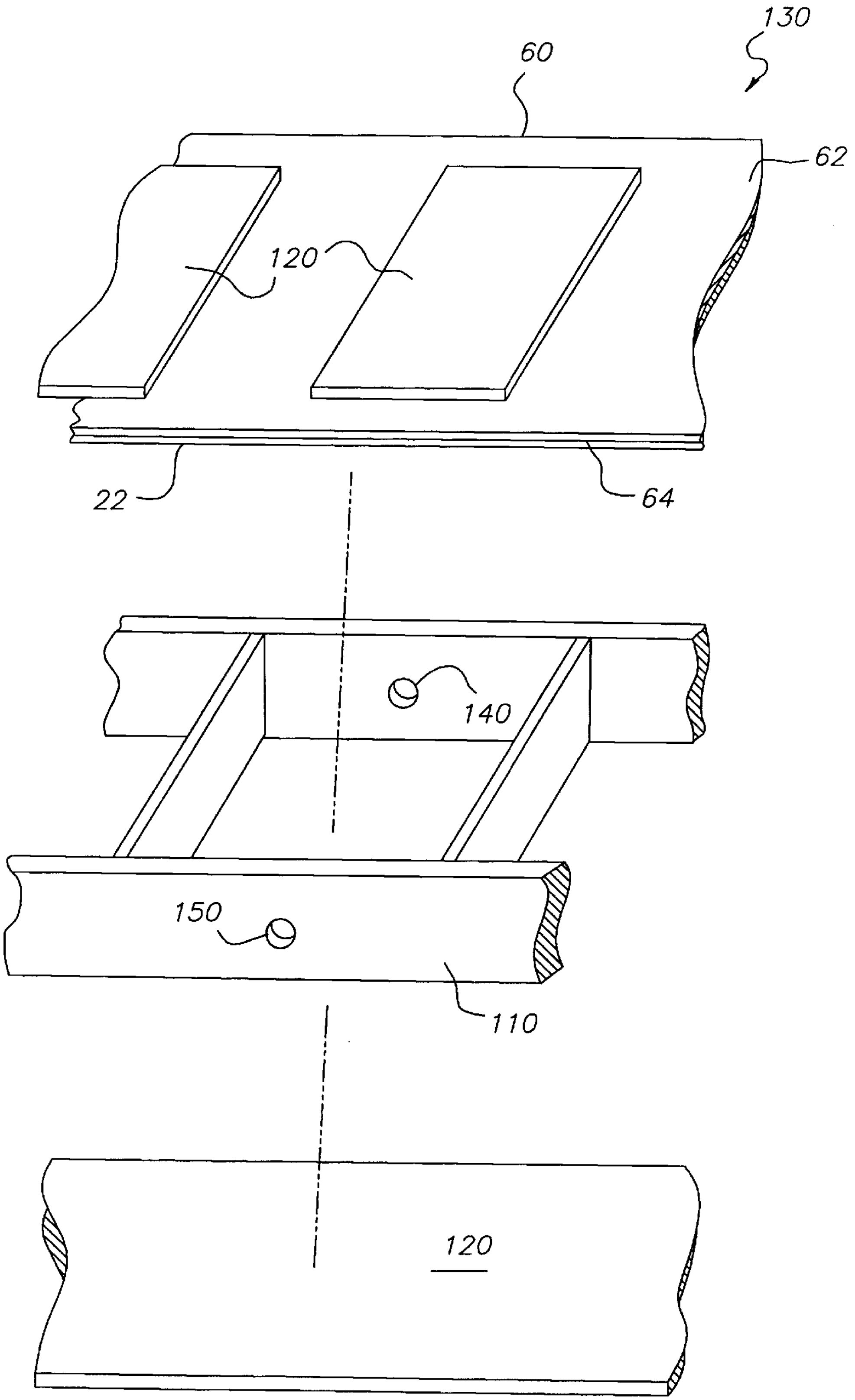
FIG. 2 is an exploded view of a portion of the ink jet head of the invention.
Figure 9:
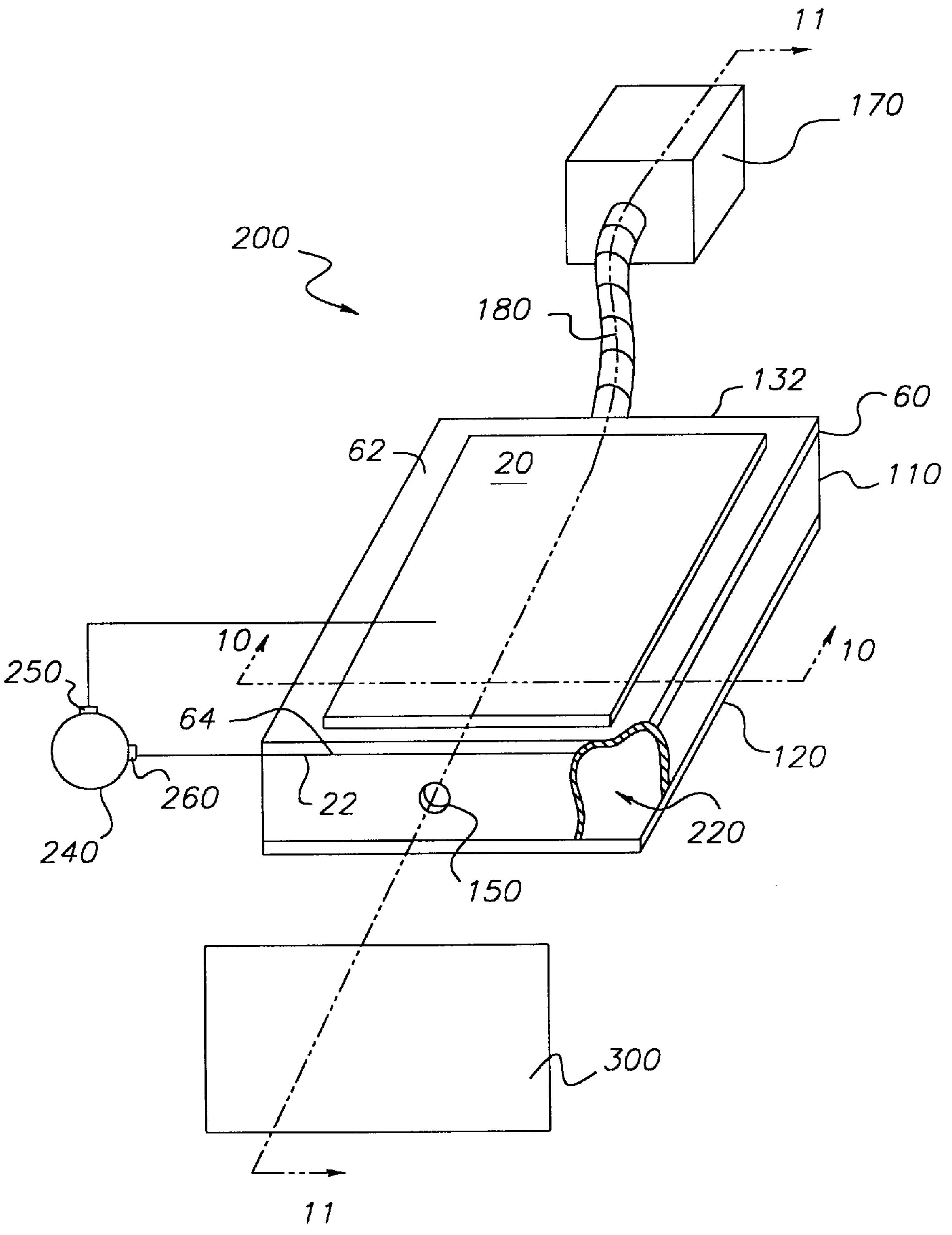
FIG. 9 is a perspective view of a single ink jet element of the invention with a partial cut away section illustrating the internal ink storage chamber.

Turning now to the drawings, and particularly to FIGS. 1, 2, and 9, the ink jet head 100 of the present invention is illustrated. As depicted in FIGS. 1 and 2, ink jet head 100 comprises a body 110, a base 120, and a piezoelectric actuating element 130. The body 110 has a plurality of separated compartments each having an inlet orifice 140 and outlet orifice 150. The base 120 and piezoelectric actuating element 130 are fixedly attached to the body 110 in such a way so as to form a contiguous array of individual ink jet elements 200 (see FIG. 9) each of which having an ink storage chamber 220 with an inlet orifice 140 and outlet orifice 150 and a piezoelectric actuator 132. The piezoelectric actuating element 130 comprises a slab of piezoelectric material 60 with first and second surfaces 62 and 64, respectively, and a plurality of first surface electrodes 20 mounted on the first surface 62 of slab of piezoelectric material 60 and a second surface electrode 22 extending substantially lengthwise along the second surface 62 of the slab of piezoelectric material 60. Each one of said plurality of first electrodes 20 is operably associated to one of said plurality of ink storage chambers 220, respectively. A power source 160 has a plurality of first terminals 156 respectively connected to the plurality of first surface electrodes 20 via wires 162 and a second terminal 158 electrically connected to the second surface electrode 22 via wire 164. The power source 160 can impart a voltage of a specified polarity and magnitude to any one of the plurality of first electrodes 20, and different such voltages simultaneously to any number of the plurality of first electrodes 20, and a different voltage to the second electrode 22 of piezoelectric actuating element 130. An ink reservoir 170 is connected via fluid conduits 180 to inlet orifices 140 for supplying ink to the ink jet head 100. The ink jet head 100 is adapted to receive ink from an ink reservoir 170 which is in fluid communications with the inlet orifices 140, and eject droplets of the ink onto a receiver (not shown) to form an image as will be described.

Figure 3:
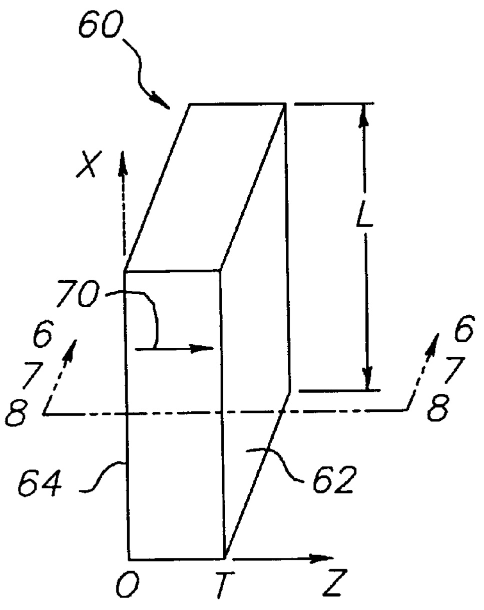
FIG. 3 is a perspective view of a slab of piezoelectric material with a functionally gradient $d_{31}$ coefficient.
Figure 4:
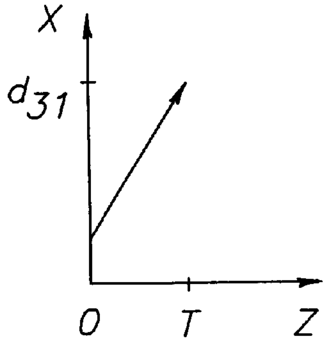
FIG. 4 is a plot of the piezoelectric $d_{31}$ coefficient across the width (T) of the slab of piezoelectric material of FIG. 3.
Figure 5:
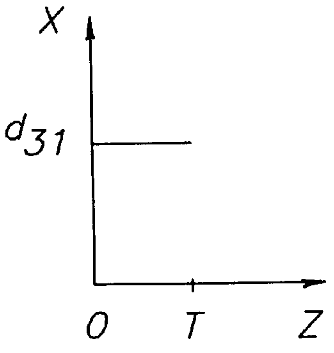
FIG. 5 is a plot of piezoelectric $d_{31}$ coefficient across the width (T) of a conventional piezoelectric bimorph transducer element, respectively.

Referring to FIGS. 3, 4 and 5, a perspective view is shown of the slab of piezoelectric material 60 with a functionally gradient $d_{31}$ coefficient. Slab of piezoelectric material 60 has first and second surfaces 62 and 64, respectively. The width of the slab of piezoelectric material 60 is denoted by T and runs perpendicular to the first and second surfaces 62 and 64, respectively, as shown. The length of the slab of piezoelectric material 60 is denoted by L and runs parallel to the first and second surfaces 62 and 64, respectively, as shown. Slab of piezoelectric material 60 is poled perpendicularly to the first and second surfaces 62 and 64 as indicated by polarization vector 70.

Skilled artisans will appreciate that in conventional piezoelectric transducers the piezoelectric "d"-coefficients is constant throughout the slab of piezoelectric material 60. Moreover, the magnitude of the induced sheer and strain are related to these "d"-coefficients via the constitutive relation as is well known. However, slab of piezoelectric material 60 used in the pumping apparatus 100 of the invention is fabricated in a novel manner so that its piezoelectric properties vary in a prescribed fashion across its width as described below. The $d_{31}$ coefficient varies along a first direction perpendicular to the first surface 62 and the second surface 62, and decreases from the first surface 62 to the second surface 64, as shown in FIG. 4. This is in contrast to the uniform or constant spatial dependency of the $d_{31}$ coefficient in conventional piezoelectric elements, illustrated in FIG. 5.

In order to form the preferred slab of piezoelectric material 60 having a piezoelectric $d_3l$ coefficient that varies in this fashion, the following method may be used. A piezoelectric block is coated with a first layer of piezoelectric material with a different composition than the block onto a surface of the block. Sequential coatings of one or more layers of piezoelectric material are then formed on the first layer and subsequent layers with different compositions of piezoelectric material. In this way, the piezoelectric element is formed which has a functionally gradient composition which varies along the width of the piezoelectric element, as shown in FIG. 4.

Preferably, the piezoelectric materials used for forming the piezoelectric element is selected from the group consisting of PZT, PLZT, LiNbO3, LiTaO3, KNbO3 or BaTiO3. Most preferred in this group is PZT. For a more detailed description of the method, see cross-referenced commonly assigned U.S. patent application Ser. Nos. 091071,485, filed May 1, 1998, to Chatterjee, et al.; 091071,486, filed May 1, 1998, to Furlani, et al.; and, 09/093,268, filed Jun 8, 1998, to Chatterjee, et al., hereby incorporated herein by reference.

Figure 6:
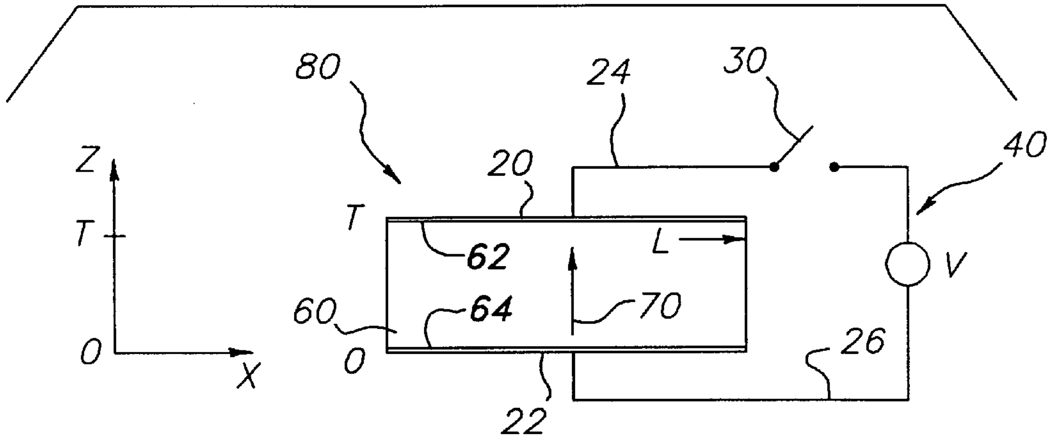
FIG. 6 is a section view along line 6—6 of FIG. 3 illustrating the piezoelectric transducer before activation.
Figure 7:
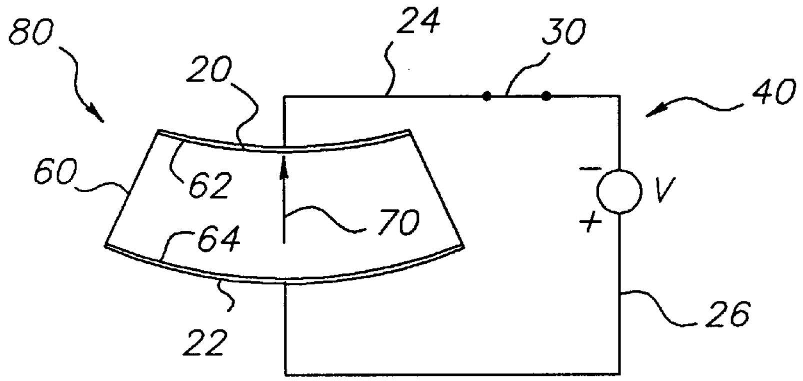
FIG. 7 is a section view taken along line 7—7 of FIG. 3 illustrating the piezoelectric transducer after activation.
Figure 8:
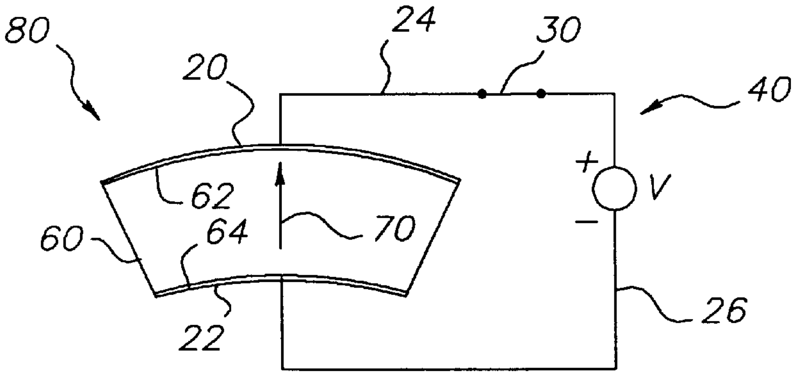
FIG. 8 is a section view taken along line 8—8 of FIG. 3 illustrating the piezoelectric transducer after activation but under a opposite polarity compared to FIG. 7.

Referring now to FIGS. 6–8, the piezoelectric transducer 80 is illustrated comprising slab of piezoelectric material 60 in the inactivated state, a first bending state and a second bending state, respectively. Piezoelectric transducer 80 comprises slab of piezoelectric material 60, with polarization vector 70, and first and second surface electrodes 20 and 22 attached to first and second surfaces 62 and 64, respectively. First and second surface electrodes 62 and 64 are connected to wires 24 and 26, respectively. Wire 24 is connected to a switch 30 that, in turn, is connected to a first terminal of voltage source 40. Wire 26 is connected to the second terminal of voltage source 40 as shown.

According to FIG. 6, the transducer 80 is shown with switch 30 open. Thus there is no voltage across the transducer 80 and it remains unactivated.

Referring to FIG. 7, the transducer 80 is shown with switch 30 closed. In this case, the voltage (V) of voltage source 40 is impressed across the transducer 80 with the negative and positive terminals of the voltage source 40 electrically connected to the first and second surface electrodes 20 and 22, respectively. Thus, the first surface electrode 20 is at a lower voltage than the second surface electrode 22. This potential difference creates an electric field through the slab of piezoelectric material 60 causing it to contract in length parallel to its first and second surfaces 62 and 64, respectively and perpendicular to polarization vector 70. Specifically the change in length (in this case contraction) is given by $S(z)=-(d_{31}(z)V/T)\times L$ as is well known. Since the functional dependence of the piezoelectric coefficient $d_{31}(z)$ increases with z as shown in FIG. 4, the lateral contraction S(z) of the slab of piezoelectric material 60 decreases in magnitude from the first surface 62 to the second surface 64. Therefore, when the first surface electrode 20 at a lower voltage than the second surface electrode 22, the slab of piezoelectric material 60 distorts into a first bending state as shown. It is important to note that the piezoelectric transducer 80 requires only one slab of piezoelectric material 60 as compared to two or more elements for the prior art bimorph transducer (not shown).

According to FIG. 8, the transducer 80 is shown with switch 30 closed. In this case, the voltage V of voltage source 40 is impressed across the transducer 80 with positive and negative terminals of the voltage source 40 electrically connected to the first and second surface electrodes 20 and 22, respectively. Thus, the first surface electrode 20 is at a higher voltgage than the second surface electrode 22. This potential difference creates an electric field through the slab of piezoelectric material 60 causing it to expand in length parallel to its first and second surfaces 62 and 64, respectively and perpendicular to polarization vector 70. Specifically, we define S(z) to be the change in length (in this case expansion) in the x (parallel or lateral) direction noting that this expansion varies as a function of z. The thickness of the piezoelectric element is given by T as shown, and therefore $S(z)=(d_{31}(z)V/T)\times L$ as is well known. The functional dependence of the piezoelectric coefficient $d_{31}(z)$ increases with z as shown in FIG. 4. Thus, the lateral expansion S(z) of the slab of piezoelectric material 60 decreases in magnitude from the first surface 62 to the second surface 64. Therefore, when the first surface electrode 20 at a higher potential than the second surface electrode 22, the slab of piezoelectric material 60 distorts into a second bending state as shown.

Referring to FIG. 9, a perspective is shown of one of the contiguous array of ink jet elements 200 of the invention. The ink jet element 200 comprises a body 110, a base 120, and a piezoelectric actuator 132. The base 120 and piezoelectric actuator 132 are fixedly attached to the body 110 as shown, thereby forming an ink storage chamber 220 which is shown in a partial cutaway view. The body 110 comprises an inlet orifice 140 (FIG. 2) and outlet orifice 150. The piezoelectric actuator 132 comprises a slab of piezoelectric material 60 with first and second surfaces 62 and 64, respectively, and a first surface electrode 20 mounted on the first surface 62 of slab of piezoelectric material 60 and a second surface electrode 22 mounted on the second surface 64 of slab of piezoelectric material 60. A power source 240 has first and second terminals 250, 260 which are connected to the first and second surface electrodes 20 and 22, respectively. An ink reservoir 170 is connected via fluid conduit 180 to inlet orifice 140 for supplying ink to the ink storage chamber 220 of the ink jet element 200. A receiver 300 is positioned in front of the outlet orifice 150 for receiving ink drops ejected from the ink jet element 200 as will be described.

Figure 10A:
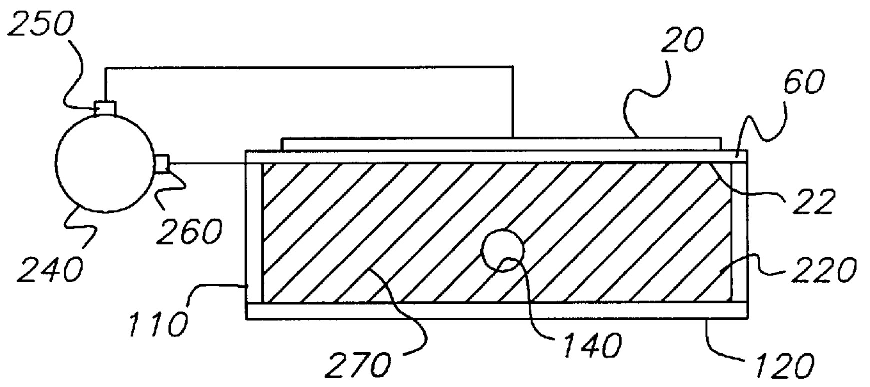
FIGS. 10A, 10B and 10C are section views of an ink jet element taken along line 10—10 of FIG. 9 showing the ink jet element in an unactivated, drop ejection, and ink refill state, respectively; and, FIGS. 11A, 11B and 11C are section views of an ink jet element taken along line 11A—11A, 11B—11B, 11C—11C, respectively, of FIG. 9 showing the ink jet element in an unactivated, drop ejection, and ink refill state, respectively.
Figure 10B:
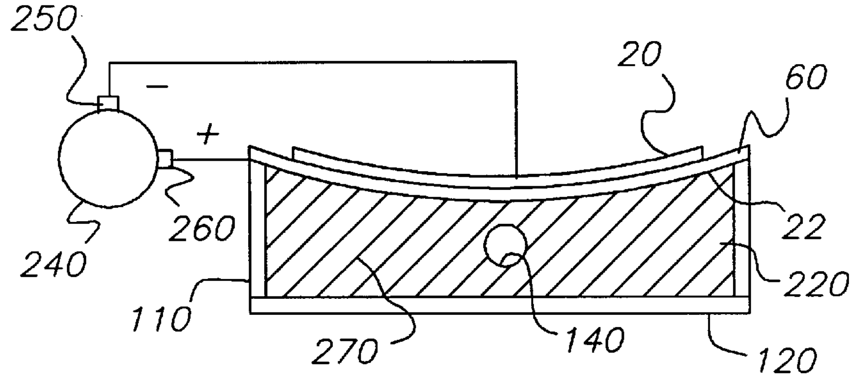
Figure 10C:
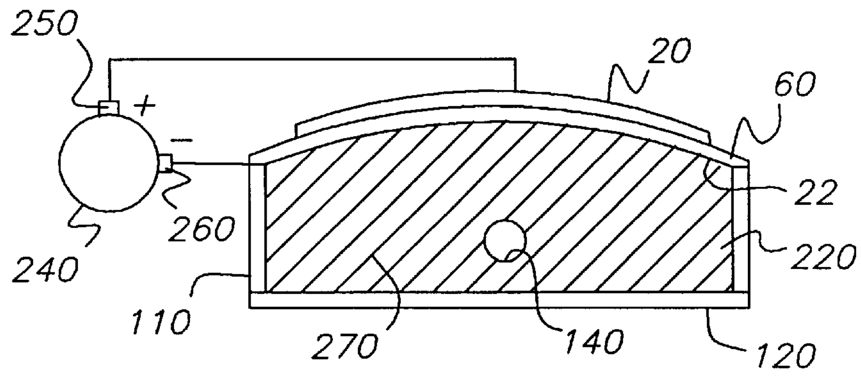
Figure 11A:
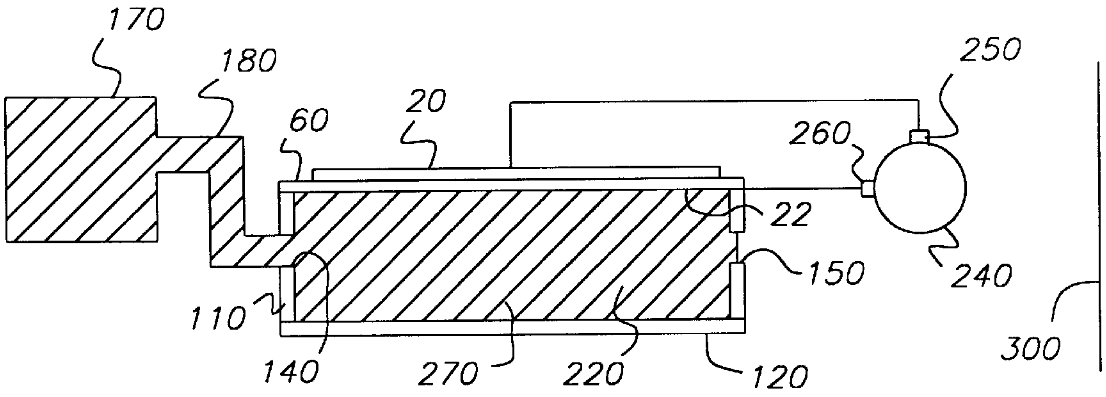
Figure 11B:
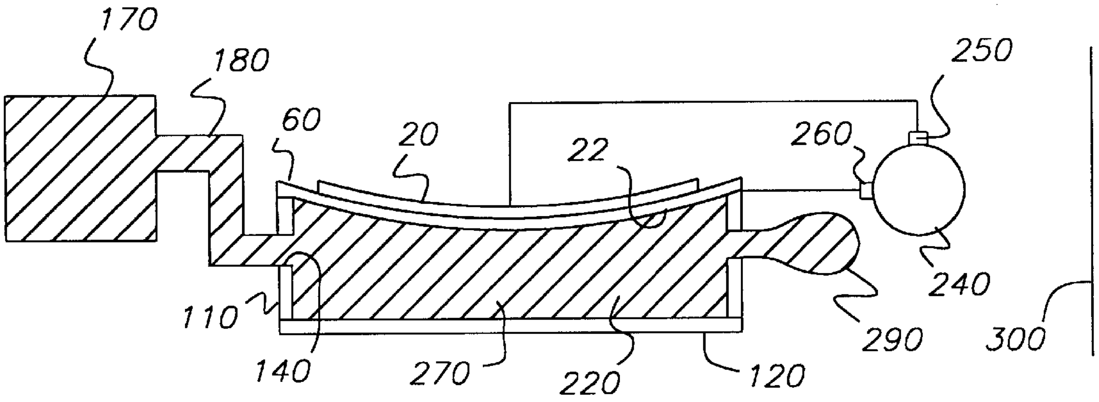
Figure 11C:
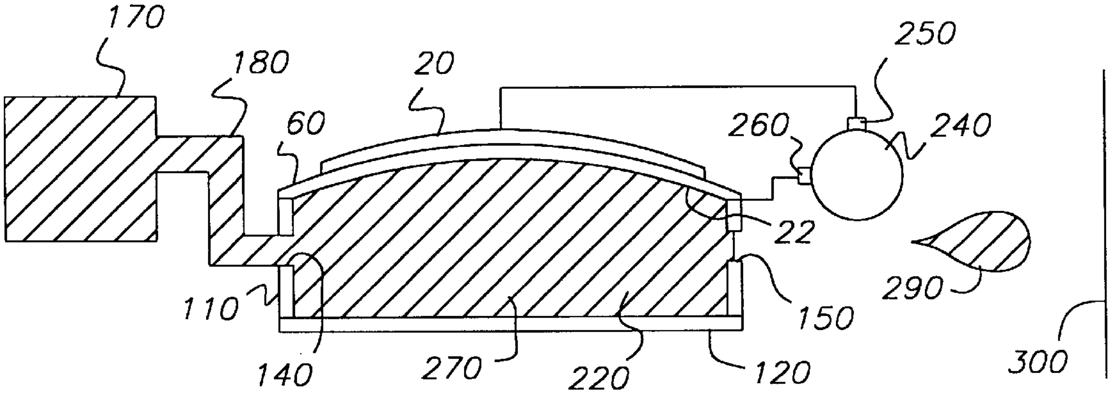

Referring now to FIGS. 10A, 10B, and 10C, and FIGS. 11A, 11B, and 11C section views are shown of ink jet element 200 taken along lines 10—10 and 11—11 of FIG. 9, respectively. The ink in the ink storage chamber 220 is indicated by the slanted lines 270. FIGS. 10A and 11A show the ink jet element 200 in an unactivated state. FIGS. 10B and 11B show the ink jet element 200 during ink drop formation and ejection, and FIGS. 10C and 11C show the ink jet element 200 during the ink refill stage.

Referring to FIGS. 10A and 11A, when the power source 240 is off, no voltage is applied to the first or second terminals 250 and 260, and therefore there is no potential difference between the first and second surface electrodes 20 and 22 an the ink jet element 200 is inactive.

Referring to FIGS. 10B and 11B, to pump a drop of ink out of the ink storage chamber 220 through the outlet orifice 150, the power source 240 provides a negative voltage to first terminal 250 and a positive voltage to second terminal 260. Thus, the first surface electrode 20 is at a lower voltage than the second surface electrode 22. This creates an electric field through the slab of piezoelectric material 60 causing it to contract in length parallel to the first and second surface electrodes 20 and 22, as discussed above. Since the functional dependence of the piezoelectric coefficient $d_{31}(z)$ increases with (z) as shown in FIG. 4, the lateral contraction of the slab of piezoelectric material 60 decreases in magnitude from the first surface electrode 20 to the second electrode 22, thereby causing the slab of piezoelectric material 60 to deform into a first bending state as shown in FIG. 7. This, in turn, decreases the free volume of the ink storage chamber 220 thereby increasing the pressure to such a level that a drop of ink 290 is ejected out through outlet orifice 150 and ultimately onto a receiver 300.

Referring to FIGS. 10C and 11C, to draw ink into the ink storage chamber 220 from the ink reservoir 170, the power source 240 provides a positive voltage to terminal 250 and a negative voltage to terminal 260. Thus, the first surface electrode 20 is at a higher voltage than the second surface electrode 22. This potential difference creates an electric field through the slab of piezoelectric material 60 causing it to expand in length parallel to the first and second surface electrodes 20 and 22 as discussed above. Since the functional dependence of the piezoelectric coefficient $d_{31}(z)$ increases with (z) as shown in FIG. 4, the lateral expansion of the slab of piezoelectric material 60 decreases in magnitude from the first surface electrode 20 to the second surface electrode 22, thereby causing the slab of piezoelectric material 60 to deform into a second bending state as shown in FIG. 8. This, in turn, increases the free volume of the ink storage chamber 220 thereby decreasing the pressure in the ink storage chamber 120 so that it is less than in the reservoir 170. Under this condition ink flows form the reservoir 170 via the conduit 180, through the inlet orifice 140 into the ink storage chamber 220.

The operation of the ink jet head 100 can now be understood via reference to FIGS. 1, 2, 9, 10, and 11. To eject a drop of ink out of one of the plurality of ink storage chambers 220, the power source 160 simultaneously imparts a voltage to the first surface electrodes 20 that is operably associated with the respective ink storage chamber 220, and a different voltage to the second electrode such that the respective first surface electrode 20 is at a lower voltage than the second surface electrode 22. This creates an electric field through a portion of the slab of piezoelectric material 60 between the respective first surface electrode 20 and the second surface electrode 22 thereby causing it to contract in length parallel to the respective first surface electrode 20. and second surface electrode 22, as discussed above. Since the functional dependence of the piezoelectric coefficient $d_{31}(z)$ increases with (z) as shown in FIG. 4, the lateral contraction of the portion of the slab of piezoelectric material 60 between the respective first surface electrode 20 and the second surface electrode 22 decreases in magnitude from the respective first surface electrode 20 to the second electrode 22, thereby causing the portion of the slab of piezoelectric material 60 between the respective first surface electrode 20 and the second surface electrode 22 to deform into a first bending state as shown in FIG. 7. This, in turn, decreases the free volume of the respective ink storage chamber 220 thereby increasing the pressure of the ink in the respective ink storage chamber 220 to such a level that a drop of ink 290 is ejected out through outlet orifice 150 of the respective ink storage chamber 220 and ultimately onto a receiver 300.

To draw ink into one of the plurality of the ink storage chambers 220 of the ink jet head 100 from the ink reservoir 170, the power source 160 simultaneously imparts a voltage the one of the plurality of first electrodes 20 that is operably associated with the specified ink storage chamber 220 and a different voltage to the second electrode such that the respective first surface electrode 20 is at a higher voltage than the second surface electrode 22. This creates an electric field through a portion of the slab of piezoelectric material 60 between the respective first surface electrode 20 and the second surface electrode 22 thereby causing it to expand in length parallel to the respective first surface electrode 20 and second surface electrode 22, as discussed above. Since the functional dependence of the piezoelectric coefficient $d_{31}(z)$ increases with (z) as shown in FIG. 4, the lateral expansion of the portion of the slab of piezoelectric material 60 between the respective first surface electrode 20 and the second surface electrode 22 increases in magnitude from the respective first surface electrode 20 to the second surface electrode 22, thereby causing the portion of the slab of piezoelectric material 60 between the respective first surface electrode 20 and the second surface electrode 22 to deform into a second bending state as shown in FIG. 7. This, in turn, increases the free volume of the respective ink storage chamber 220 thereby decreasing the pressure in the respective ink storage chamber 220 so that it is less than in the ink reservoir 170. Under this condition ink flows form the ink reservoir 170 via the conduit 180, through the inlet orifice 140 into the respective ink storage chamber 220.

Therefore, the invention has been described with reference to a preferred embodiment. However, it will be appreciated that variations and modifications can be effected by a person of ordinary skill in the art without departing from the scope of the invention.

PARTS LIST

20 first surface electrode
22 second surface electrode
24 wire
26 wire
30 switch
40 voltage source
60 slab of piezoelectric material
62 first surface
64 second surface
70 polarization vector
80 piezoelectric transducer
100 piezoelectric ink jet head
110 body
120 base
130 piezoelectric actuating element
132 piezoelectric actuator
140 inlet orifice
150 outlet orifice
156 first terminal
158 second terminal
160 power source
162 wires
164 wire
170 reservoir
180 conduit
200 ink jet element
220 ink storage chamber
240 power source
250 first terminal
260 second terminal
270 slanted lines

What is claimed is:

1. An ink jet head having a body, a base attached to said body, said body having a plurality of independent ink compartments each having an inlet orifice, an outlet orifice and a piezoelectric ink actuating element structurally associated with each of said independent ink compartments, said piezoelectric ink actuating element enabling said ink jet head to receive ink from an ink reservoir in fluid communications with said inlet orifice of each one of said plurality of independent ink compartments and then eject droplets of the ink onto a receiver to form an image, said piezoelectric actuating element comprising:

(a) a substantially planar piezoelectric transducer comprising a slab of piezoelectric material, said slab of piezoelectric material being formed by sequential layers of different compositions of piezoelectric material, each one of said sequential layers having different d-coefficients defining a functionally gradient d-coefficient throughout said slab, and wherein said slab has a first surface and an opposing second surface, a plurality of spatially separated first electrodes arranged on said first surface, wherein each one of said plurality of first electrodes is operably associated with one of said independent ink compartments, and a second electrode extending substantially lengthwise along the opposed second surface, said piezoelectric material having a functionally gradient d-coefficient selected so that said slab changes geometry in response to an applied voltage which produces an electric field in the slab; and said plurality of first electrodes and said second electrode being arranged so that voltage applied to any one of said plurality of first electrodes and said second electrode induces an electric field in a portion of said slab between said any one of said plurality of first electrodes and said second electrode; and (b) a source of power operably associated with each one of said plurality of first electrodes and to said second electrode of said piezoelectric transducer for enabling fluid flow through any one of said plurality of independent ink compartments, wherein said piezoelectric transducer is actuated for pumping ink out of any one of said independent ink compartments when said source of power applies a voltage to one of said plurality of first electrodes and simultaneously applies a different voltage to said second electrode, the voltage applied to the one of said first electrodes being somewhat lower than the voltage applied to said second electrode; and wherein said piezoelectric transducer is actuated for pumping ink from said fluid reservoir into any one of said plurality of independent ink compartments when said source of power applies a voltage to the one of said plurality of first electrodes and simultaneously applies a different voltage to said second electrode, the voltage applied to the one of said first electrode being somewhat higher than the voltage applied to said second electrode.

2. The ink jet head recited in claim 1 wherein said slab of piezoelectric material expands lengthwise between an activated one of said plurality of first electrodes and said second electrode in a direction substantially parallel to said first and second surfaces of said slab causing a decrease in free volume in said one of said plurality of independent ink compartments and a corresponding increase in pressure thereby causing a droplet of ink to exit said outlet orifice of said one of said plurality of independent ink compartments; and, alternately, wherein said slab of said piezoelectric actuating element contracts lengthwise between an activated one of said plurality of first electrodes and said second electrode in a direction substantially parallel to said first and second surfaces of said slab causing an increase in free volume in said one of said plurality of independent ink compartments and a corresponding decrease in pressure thereby causing thereby causing ink to flow from said ink reservoir into said one of said plurality of independent ink compartments.

3. The ink jet head recited in claim 1 wherein said piezoelectric material is selected from the group consisting of PZT, PLZT, $LiNbO_3$, $KnbO_3$, $BaTiO_3$ and a mixture thereof.

4. The ink jet head recited in claim 1 wherein said piezoelectric material is PZT.

5. The ink jet head recited in claim 1 wherein the geometry of the slab changes to produce bending which includes elongation, contraction, shear, or combinations thereof.

* * * * *